United States Patent
Wang

(10) Patent No.: US 12,170,232 B2
(45) Date of Patent: Dec. 17, 2024

(54) MANUFACTURING METHOD AND MEASUREMENT METHOD OF SEMICONDUCTOR STRUCTURE, ANDSEMICONDUCTOR STRUCTURE

(71) Applicant: CHANGXIN MEMORY TECHNOLOGIES, INC., Hefei (CN)

(72) Inventor: Fangfang Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 424 days.

(21) Appl. No.: 17/647,654

(22) Filed: Jan. 11, 2022

(65) Prior Publication Data

US 2022/0352040 A1  Nov. 3, 2022

Related U.S. Application Data

(63) Continuation of application No. PCT/CN2021/111569, filed on Aug. 9, 2021.

(30) Foreign Application Priority Data

Apr. 30, 2021 (CN) .......................... 202110484441.3

(51) Int. Cl.
  *H01L 21/66* (2006.01)
  *H01L 29/40* (2006.01)
  *H01L 29/423* (2006.01)

(52) U.S. Cl.
  CPC ............ *H01L 22/12* (2013.01); *H01L 29/401* (2013.01); *H01L 29/4236* (2013.01)

(58) Field of Classification Search
  CPC .......................... H01L 22/12; H01L 29/4236
  See application file for complete search history.

(56) References Cited

U.S. PATENT DOCUMENTS

| 9,431,496 | B2* | 8/2016 | Kang ................... H10B 12/488 |
| 10,818,666 | B2 | 10/2020 | Simsek-Ege et al. |
| 11,133,315 | B2 | 9/2021 | Kim et al. |
| 11,177,264 | B2 | 11/2021 | Jeon et al. |

(Continued)

FOREIGN PATENT DOCUMENTS

| CN | 102080949 A | 6/2011 |
| CN | 107290306 A | 10/2017 |

(Continued)

OTHER PUBLICATIONS

International Search Report cited in PCT/CN2021/111569 mailed Dec. 27, 2021, 9 pages.

*Primary Examiner* — Joseph C. Nicely
(74) *Attorney, Agent, or Firm* — Syncoda LLC; Feng Ma

(57) ABSTRACT

The present disclosure provides a manufacturing method and measurement method of a semiconductor structure, and a semiconductor structure, relating to the technical field of semiconductors. The manufacturing method of a semiconductor structure includes: providing a base including multiple gate trenches; and forming a gate structure in each of the gate trenches, wherein each gate structure includes a barrier layer and a conductive layer, the barrier layer and the conductive layer are sequentially stacked, the barrier layer is in contact with a bottom wall of each of the gate trenches, and a material of the conductive layers includes polysilicon.

14 Claims, 8 Drawing Sheets

(56) References Cited

U.S. PATENT DOCUMENTS

| | | | |
|---|---|---|---|
| 2017/0155146 A1* | 6/2017 | Lee | C01G 53/50 |
| 2020/0168611 A1* | 5/2020 | Jeon | H10B 12/482 |
| 2022/0302253 A1* | 9/2022 | Zhang | H01L 21/764 |

FOREIGN PATENT DOCUMENTS

| | | | |
|---|---|---|---|
| CN | 110911407 A | 3/2020 | |
| CN | 110993685 A | 4/2020 | |
| CN | 111223862 A | 6/2020 | |
| CN | 111653566 A | 9/2020 | |

* cited by examiner

MANUFACTURING METHOD AND MEASUREMENT METHOD OF SEMICONDUCTOR STRUCTURE, ANDSEMICONDUCTOR STRUCTURE

CROSS-REFERENCE TO RELATED APPLICATIONS

This is a continuation of International Application No. PCT/CN2021/111569, filed on Aug. 9, 2021, which claims the priority to Chinese Patent Application No. 202110484441.3, titled "MANUFACTURING METHOD AND MEASUREMENT METHOD OF SEMICONDUCTOR STRUCTURE, AND SEMICONDUCTOR STRUCTURE" and filed with the China National Intellectual Property Administration (CNIPA) on Apr. 30, 2021. The entire contents of International Application No. PCT/CN2021/111569 and Chinese Patent Application No. 202110484441.3 are incorporated herein by reference.

TECHNICAL FIELD

The present disclosure relates to the technical field of semiconductors, and in particular to a manufacturing method and measurement method of a semiconductor structure, and a semiconductor structure.

BACKGROUND

In the semiconductor manufacturing process, a semiconductor structure is formed on a semiconductor base by processes such as photolithography, etching or deposition. For example, a dynamic random access memory (DRAM) is a semiconductor memory that randomly writes and reads data at a high speed, and is widely used in data storage devices or apparatuses.

A DRAM usually includes a base and trenches provided inside the base. A barrier layer is provided on an inner wall of the trenches, and the barrier layer defines gate trenches. A gate is provided inside each gate trench, and a top surface of each gate is lower than a top surface of the base.

With the development of the DRAM towards miniaturization and integration, the size of each trench is also reduced, which in turn reduces the width size of each gate and affects the storage performance of the DRAM.

SUMMARY

A first aspect of the embodiments of the present disclosure provides a method of manufacturing a semiconductor structure. The method includes:
providing a base;
forming multiple gate trenches arranged at intervals on the base; and
forming a gate structure in each of the gate trenches, wherein each gate structure includes a barrier layer and a conductive layer, the barrier layer and the conductive layer are sequentially stacked, the barrier layer is in contact with a bottom wall of each of the gate trenches, and a material of conductive layers includes polysilicon.

A second aspect of the embodiments of the present disclosure provides a semiconductor structure, including: a base and multiple gate trenches arranged at intervals in the base, wherein a gate structure is provided in each of the gate trenches, each gate structure includes a barrier layer and a conductive layer, the barrier layer and the conductive layer are sequentially stacked, the barrier layer is in contact with a bottom wall of each of the gate trenches, and a material of the conductive layers includes polysilicon.

A third aspect of the embodiments of the present disclosure provides a method of measuring a semiconductor structure. The method includes:
providing a to-be-tested semiconductor structure, wherein the to-be-tested semiconductor structure includes a base and multiple gate trenches arranged at intervals in the base, a gate structure is provided in each of the gate trenches, each gate structure includes a barrier layer and a conductive layer, the barrier layer and the conductive layer are sequentially stacked, the barrier layer is in contact with a bottom wall of each of the gate trenches, and a material of the conductive layers includes polysilicon;
forming a mask layer on the base, wherein the mask layer includes multiple mask strips arranged at intervals, and each of the mask strips is located between the adjacent gate trenches;
transmitting the to-be-tested semiconductor structure provided with the mask strips to a measurement device, the measurement device being configured to measure a width of each of the conductive layers and a width of each of the mask strips;
transmitting the to-be-tested semiconductor structure provided with the mask strips to a photoelectron spectroscopy device, the photoelectron spectroscopy device being configured to measure a dopant atom concentration in the conductive layers to obtain a measured value of the dopant atom concentration;
determining a theoretical value of the dopant atom concentration in the conductive layers according to the width of each of the conductive layers, the width of each of the mask strips, and the measured value of the dopant atom concentration; and
determining an actual value of the dopant atom concentration in the conductive layers according to the theoretical value of the dopant atom concentration in the conductive layers and a correction factor.

The present disclosure provides a manufacturing method and a measurement method of a semiconductor structure, and a semiconductor structure. The present disclosure describes the technical problems solved by the embodiments of the present disclosure, the technical features constituting the technical solutions and the beneficial effects brought about by the technical features of these technical solutions. In addition, other technical problems to be solved by the embodiments of the present disclosure, other technical features included in the technical solutions and beneficial effects brought about by these technical features will be described in further detail in the detailed description.

DETAILED DESCRIPTION

A DRAM usually includes a base and trenches provided inside the base. A barrier layer is provided on an inner wall of each of the trenches, and the barrier layer defines gate trenches. A gate is provided inside each of the gate trenches, and a top surface of each gate is lower than a top surface of the base. As the width of each gate trench decreases, the width of each gate also decreases. This affects the storage performance of the DRAM.

Based on the foregoing technical problem, the embodiments of the present disclosure provide a manufacturing method and a measurement method of a semiconductor structure, and a semiconductor structure. Sidewalls of each conductive layer are in contact with an inner wall of each gate trench, that is, a width of each conductive layer is equal to a width of each gate trench along a first direction. The present disclosure can increase the width of each conductive layer and ensure the conductivity of the conductive layer on the one hand, and on the other hand, the present disclosure can reduce the width of each gate trench while ensuring the conductivity of each conductive layer, which helps the development of the semiconductor structure towards integration.

In order to make the objectives, features and advantages of the embodiments of the present disclosure clearer, the technical solutions in the embodiments of the present disclosure are described clearly and completely below with reference to the accompanying drawings in the embodiments of the present disclosure. Apparently, the described embodiments are some rather than all of the embodiments of the present disclosure. All other embodiments obtained by a person of ordinary skill in the art based on the embodiments of present disclosure without creative efforts should fall within the protection scope of the present disclosure.

The semiconductor structure is not limited in this embodiment. The semiconductor structure is described below by taking a dynamic random access memory (DRAM) as an example, but this embodiment is not limited to this, and the semiconductor structure in this embodiment may also be other structures.

Embodiment 1

Figure 1:
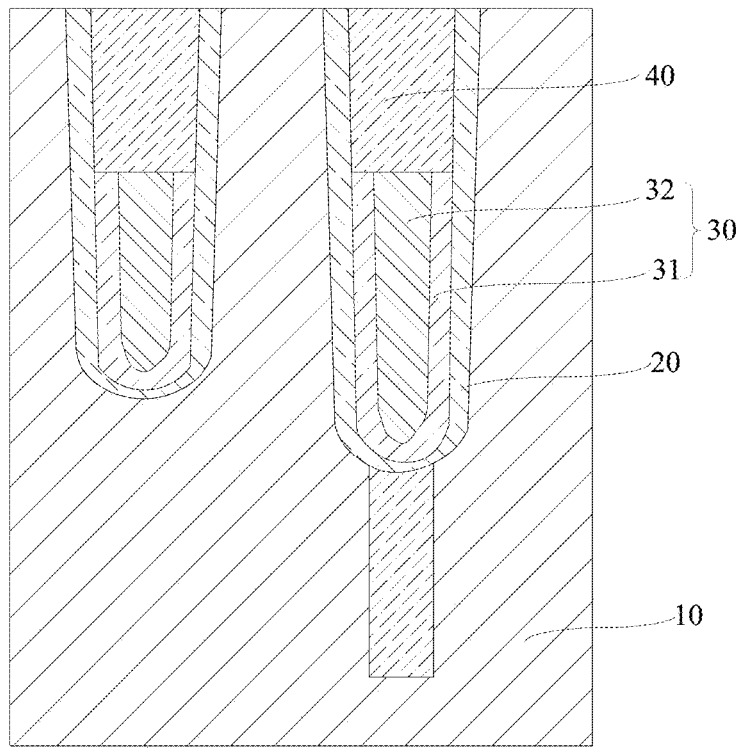
FIG. 1 is a schematic diagram of a semiconductor structure in the related art.
Figure 2:
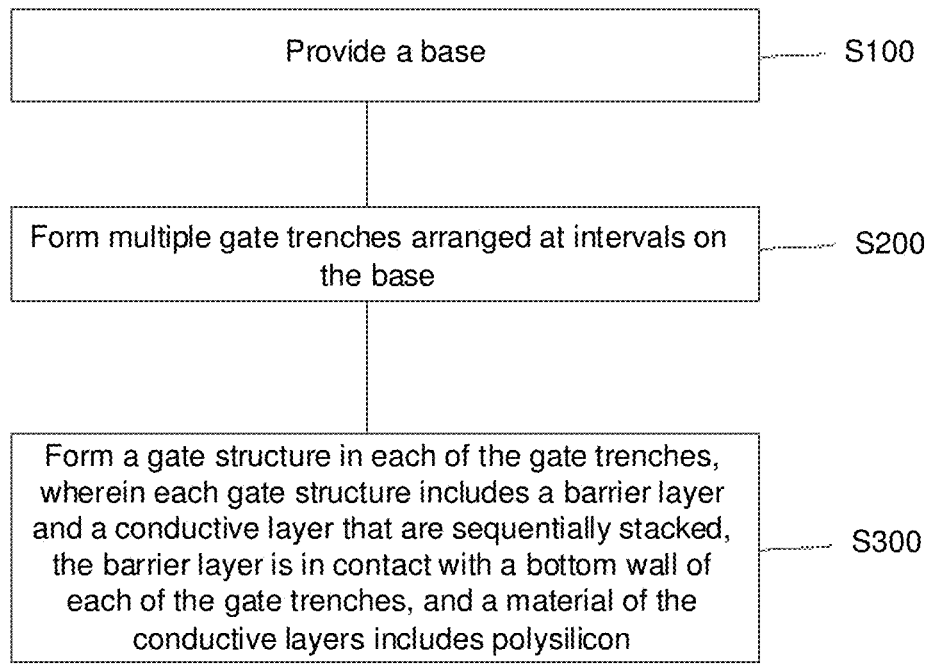
FIG. 2 is a process flowchart of a method of manufacturing a semiconductor structure according to an embodiment of the present disclosure.

As shown in FIG. 2, an embodiment of the present disclosure provides a method of manufacturing a semiconductor structure. The method includes:

Step S100: Provide a base.

Figure 3:
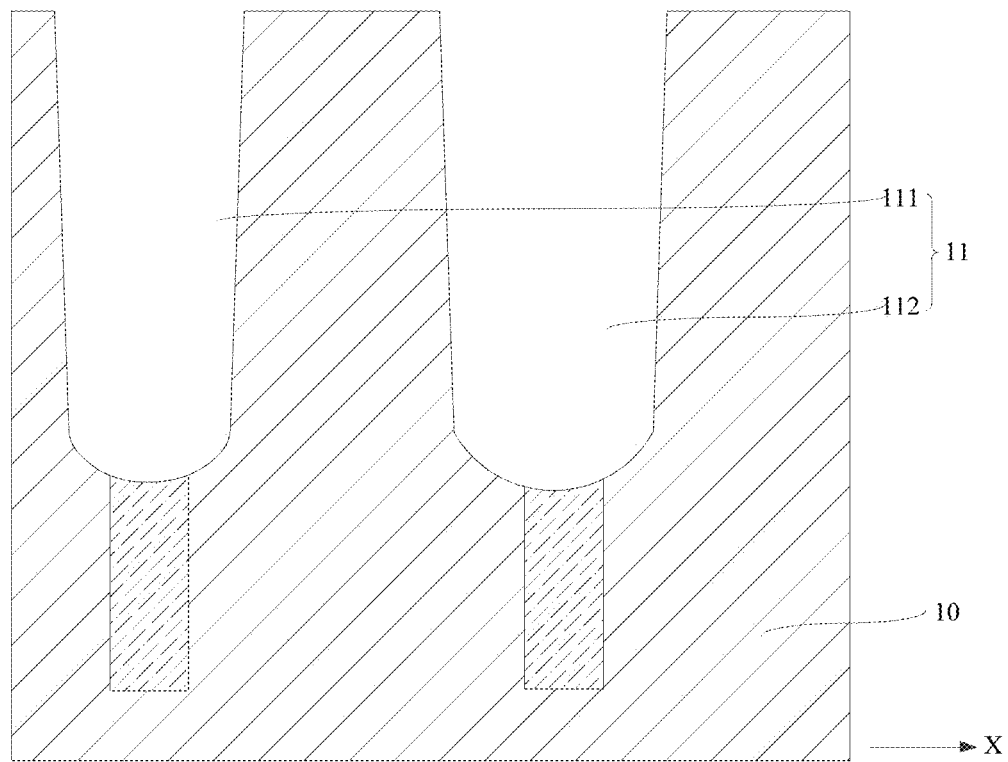
FIG. 3 is a schematic structural diagram of forming gate trenches in the method of manufacturing a semiconductor structure according to an embodiment of the present disclosure.

For example, as shown in FIG. 3, the base 10 serves as a support member of a memory and is configured to support other components provided thereon. The base 10 may be made of a semiconductor material. The semiconductor material may be one or more of the group consisting of silicon, germanium, silicon-germanium, and silicon-carbon.

Step S200: Form multiple gate trenches arranged at intervals on the base.

For example, a photoresist layer may be formed on the base 10, and the photoresist layer may be patterned by exposure, development or etching to form multiple openings in the photoresist layer. Then the base exposed in each opening is removed by using an etching solution or an etching gas to form multiple gate trenches 11 in the base. The multiple gate trenches 11 are arranged at intervals along a first direction, wherein the first direction may be a horizontal direction, i.e., the X direction in FIG. 3.

Widths of the gate trenches 11 along the first direction may or may not be equal, and when the widths of the gate trenches are unequal, the widths of the gate trenches can be limited by controlling the size of each opening.

For example, the widths of two adjacent gate trenches 11 may be unequal. In order to limit the size of each gate trench, the multiple gate trenches 11 in this embodiment are divided into a plurality of first gate trenches 111 and a plurality of second gate trenches 112. Along the first direction, the plurality of first gate trenches 111 and the plurality of second gate trenches 112 are arranged alternately, and the width of each first gate trench 111 and the width of each second gate trench 112 are not equal.

For example, as shown in FIG. 3, the width of each first gate trench 111 is smaller and the width of each second gate trench 112 is larger, so that small gate trenches and large gate trenches are arranged alternately along the first direction. This embodiment can effectively use the area of the wafer by the above arrangement, thereby improving the storage performance of the semiconductor structure.

Step S300: Form a gate structure in each of the gate trenches, wherein each gate structure includes a barrier layer and a conductive layer that are sequentially stacked, the barrier layer is in contact with a bottom wall of each of the gate trenches, and a material of the conductive layers includes polysilicon.

For example, before the gate structure is formed inside each gate trench, it is further necessary to form a gate oxide layer 20 on the inner wall of each gate trench, so that the gate structures 30 are insulated from the base 10 by the gate oxide layer 20.

Figure 4:
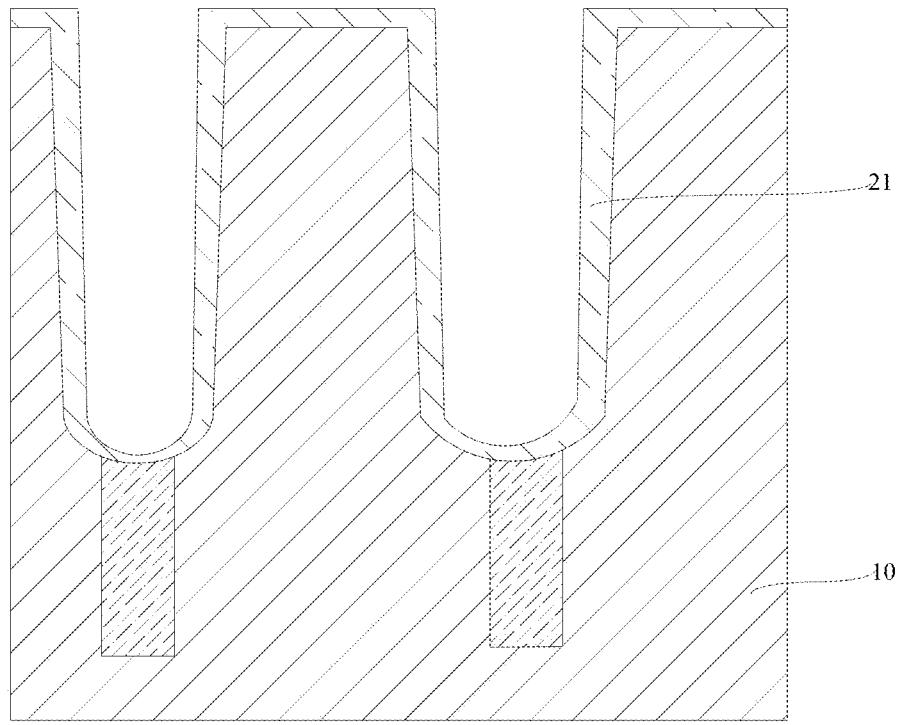
FIG. 4 is a schematic structural diagram of forming an initial gate oxide layer in the method of manufacturing a semiconductor structure according to an embodiment of the present disclosure.

Specifically, as shown in FIG. 4, an initial gate oxide layer 21 can be formed on the inner wall of each gate trench 11 by using an atomic layer deposition process. The initial gate oxide layer 21 extends to the outside of the gate trenches 11 and covers a top surface of the base 10.

Figure 5:
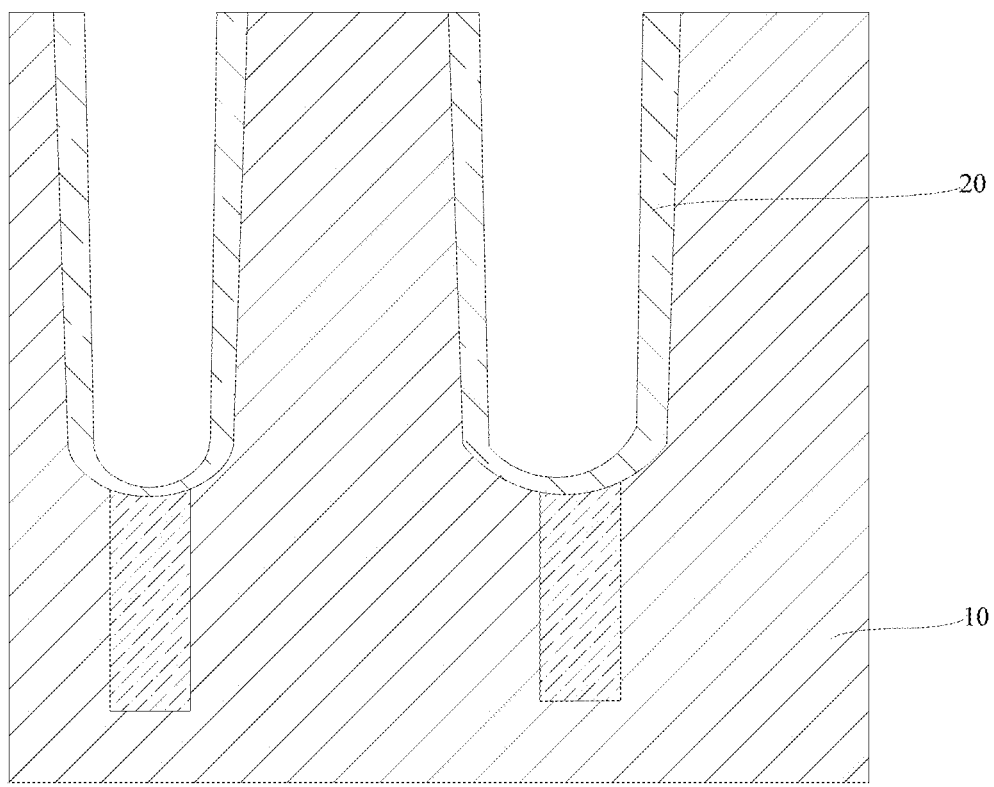
FIG. 5 is a schematic structural diagram of forming a gate oxide layer in the method of manufacturing a semiconductor structure according to an embodiment of the present disclosure.

Afterwards, as shown in FIG. 5, the initial gate oxide layer 21 on the base 10 is removed by using an etching solution or etching gas, and the initial gate oxide layer 21 inside the gate trenches 11 is retained. The retained initial gate oxide layer 21 forms the gate oxide layer 20, wherein a material of the gate oxide layer 20 may include silicon oxide, etc.

Figure 6:
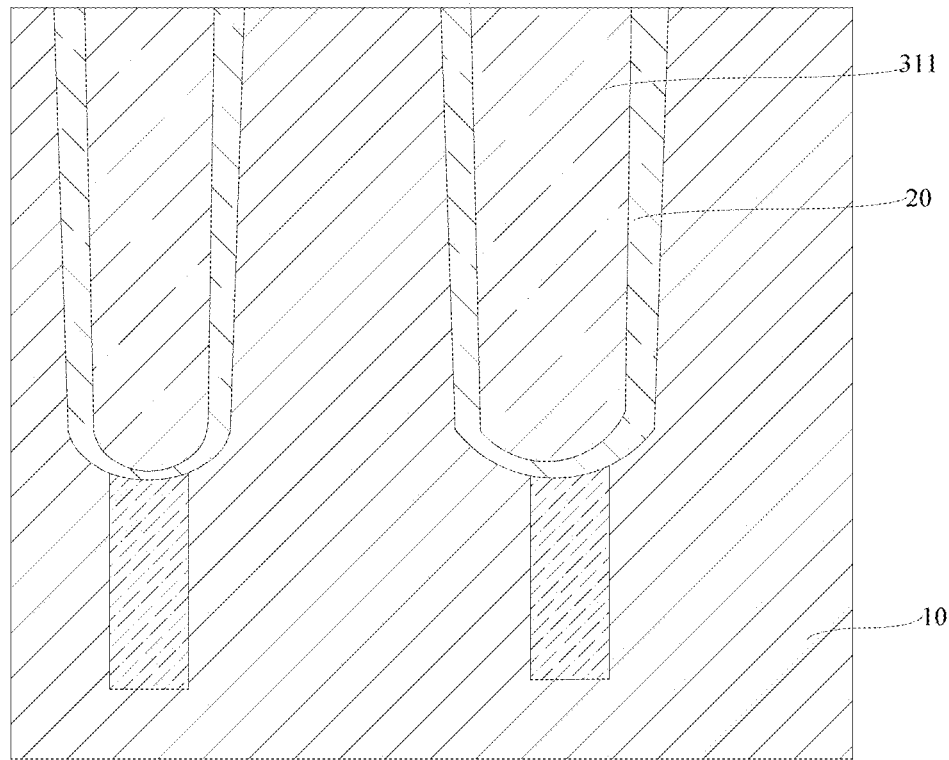
FIG. 6 is a schematic structural diagram of forming an initial barrier layer in the method of manufacturing a semiconductor structure according to an embodiment of the present disclosure.

Finally, the gate structures 30 are formed in areas enclosed by the gate oxide layer 20, and the specific process steps are as follows:

As shown in FIG. 6, an initial barrier layer 311 is formed in each gate trench 11, and the initial barrier layer 311 fills the gate trenches 11, i.e., the gate trenches can be filled with the initial barrier layer 311 by using a chemical vapor deposition process or a physical vapor deposition process.

Figure 7:
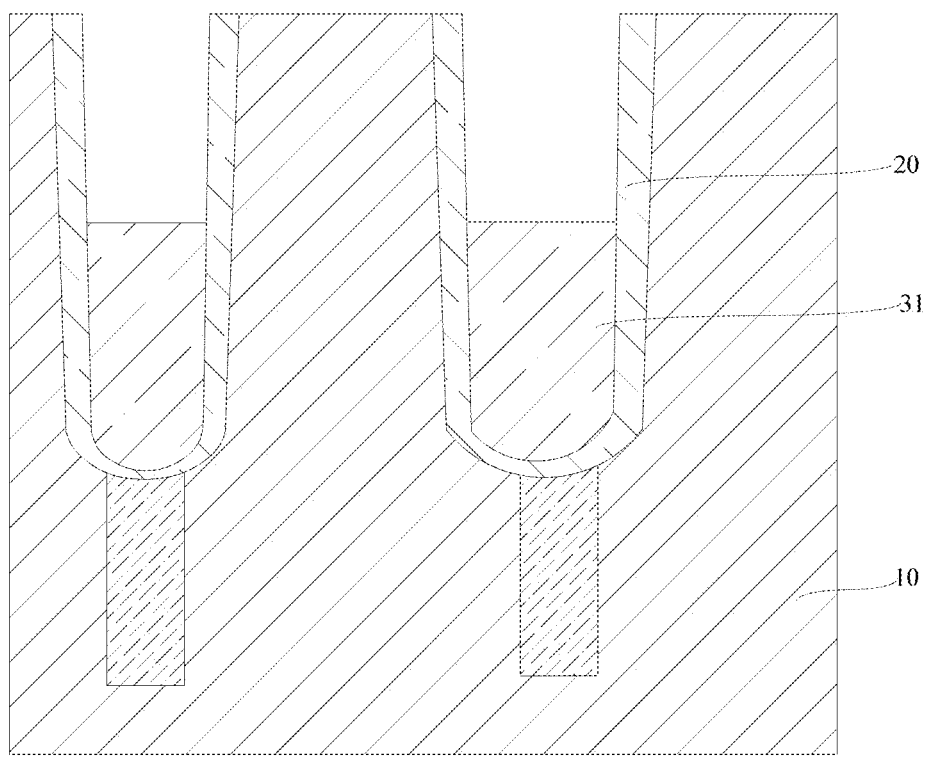
FIG. 7 is a schematic structural diagram of forming a barrier layer in the method of manufacturing a semiconductor structure according to an embodiment of the present disclosure.

As shown in FIG. 7, after the initial barrier layer 311 is formed, the initial barrier layer 311 located in the gate trenches 11 is removed by a certain thickness by using an etching solution or etching gas, and the retained initial barrier layer 311 forms the barrier layer 31.

A material of the barrier layer 31 may include a conductive material such as titanium nitride, the titanium nitride prevents penetration between the conductive material in the gate structures and the base, and also achieves conductivity to ensure the performance of the semiconductor structure.

Figure 8:
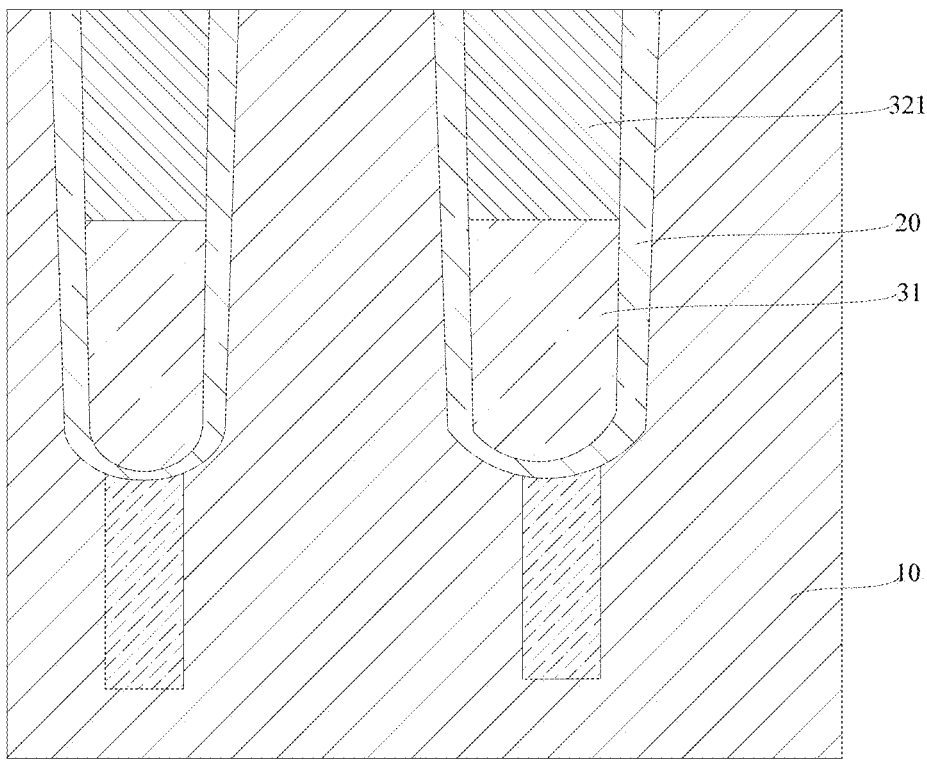
FIG. 8 is a schematic structural diagram of forming an initial conductive layer in the method of manufacturing a semiconductor structure according to an embodiment of the present disclosure.

As shown in FIG. 8, after the barrier layer 31 is formed, an initial conductive layer 321 is formed on the barrier layer 31 by using a chemical vapor deposition process or physical vapor deposition process; the initial conductive layer 321 fills the gate trenches 11 located above the barrier layer 31.

Figure 9:
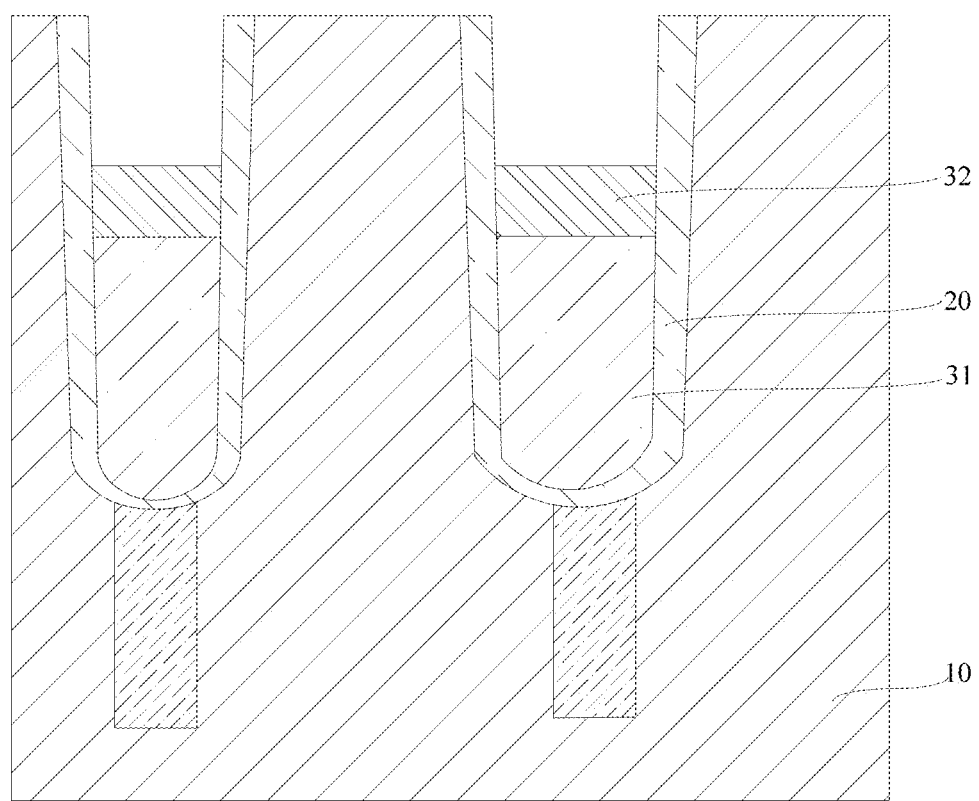
FIG. 9 is a schematic structural diagram of forming conductive layers in the method of manufacturing a semiconductor structure according to an embodiment of the present disclosure.

As shown in FIG. 9, the initial conductive layer 321 located in the gate trenches 11 is removed by a certain thickness by using an etching solution or etching gas, and the retained initial conductive layer 321 is formed into the conductive layers 32, wherein a material of the conductive layers 32 may include polysilicon.

In this embodiment, sidewalls of each conductive layer are in contact with the inner wall of each gate trench, that is, the width of each conductive layer is equal to the width of each gate trench along the first direction. This embodiment can increase the width of each conductive layer and ensure the conductivity of each conductive layer on the one hand, and on the other hand, can reduce the width of each gate trench while ensuring the conductivity of each conductive layer, which helps the development of the semiconductor structure towards integration.

In some embodiments, the thickness of each conductive layer 32 is ¼ to ½ of the depth of each gate trench 11. If the ratio of the thickness of each conductive layer 32 to the depth of each gate trench 11 is less than 1:4, the thickness of each conductive layer will be reduced, thus reducing the conductivity of each conductive layer. If the ratio of the thickness of each conductive layer 32 to the depth of each gate trench 11 is greater than 1:2, the height of each conductive layer will be increased, which easily causes the gate structures to be electrically connected to other devices installed on the base, increases the risk of leakage current in the gate structures, and reduces the performance of the semiconductor structure. Therefore, this embodiment limits the thickness of each conductive layer and the depth of each gate trench to ensure both the conductivity of each conductive layer and the performance of the semiconductor structure.

Figure 10:
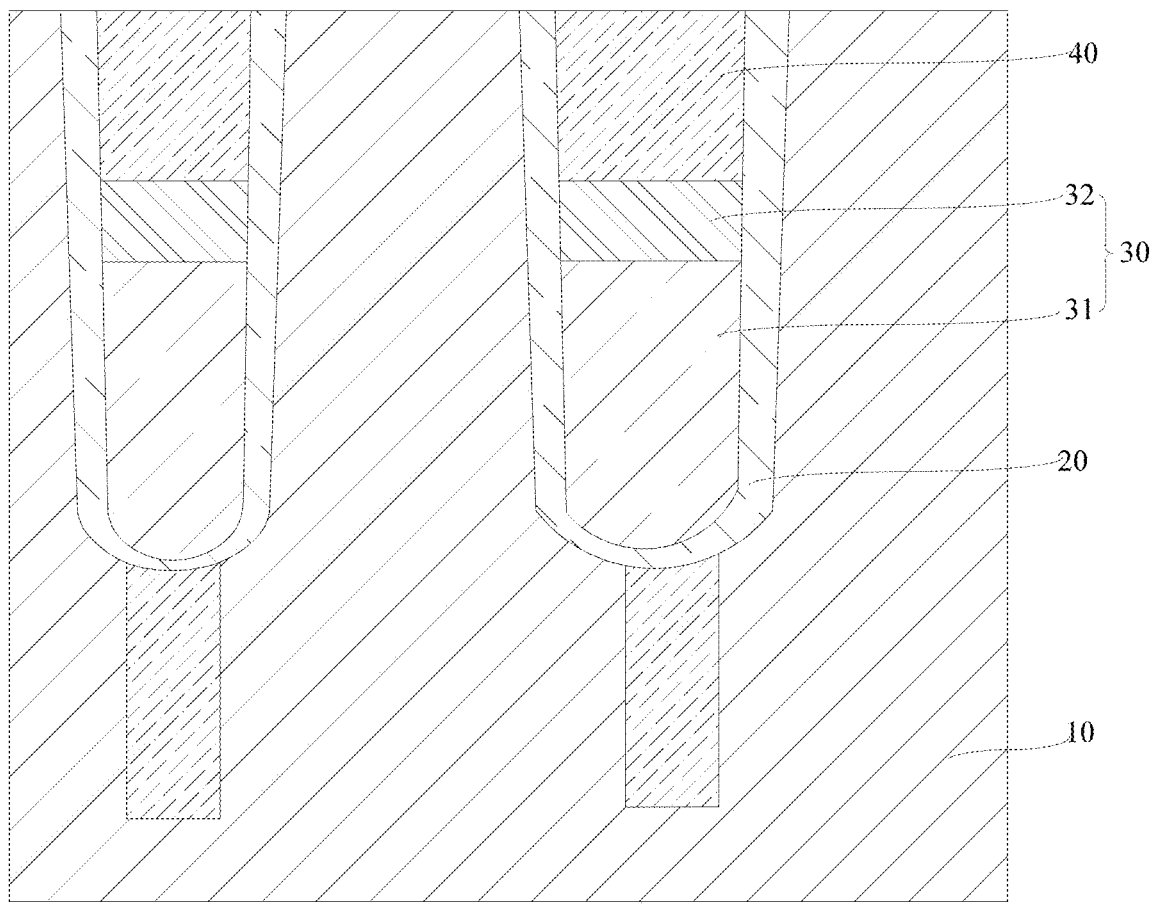
FIG. 10 is a schematic structural diagram of forming a dielectric layer in the method of manufacturing a semiconductor structure according to an embodiment of the present disclosure.

As shown in FIG. 10, in some embodiments, after the forming a gate structure in each of the gate trenches, the manufacturing method further includes: forming a dielectric layer 40 on each conductive layer 32, i.e., forming a dielectric layer 40 in each gate trench 11 located above each conductive layer 32 by using a chemical vapor deposition process or a physical vapor deposition process. The dielectric layer 40 fills each gate trench 11 located above each conductive layer 32, so that the top surface of the dielectric layer 40 is flush with the top surface of the base 10.

In this embodiment, the dielectric layer is provided to insulate the gate structures from other devices on the base, wherein the material of the dielectric layer may include silicon nitride.

Embodiment 2

As shown in FIG. 10, an embodiment of the present disclosure further provides a semiconductor structure, including: a base 10 and multiple gate trenches 11 arranged at intervals in the base 10, wherein a gate structure 30 is provided in each of the gate trenches 11, each gate structure 30 includes a barrier layer 31 and a conductive layer 32 that are sequentially stacked, the barrier layer 31 is in contact with a bottom wall of each gate trenches 11, and a material of the conductive layers 32 includes polysilicon.

In the related art, a barrier layer and a conductive layer of a semiconductor structure are usually sequentially stacked on an inner wall of each gate trench. If the size of the semiconductor structure needs to be reduced, the width of each gate trench and the width of each conductive layer will be reduced correspondingly, affecting the performance of the semiconductor structure.

In the semiconductor structure provided in this embodiment, each conductive layer is provided on the barrier layer, and an outer wall of each conductive layer fits the inner wall of each gate trench. In this way, under the premise of reducing the semiconductor structure, this embodiment can avoid excessive reduction in the width of each conductive layer, thus ensuring the performance of the semiconductor structure, and also facilitating the development of semiconductor structure towards integration.

In some embodiments, the widths of the gate trenches 11 along a first direction may or may not be equal. For example, the multiple gate trenches 11 include a plurality of first gate trenches 111 and a plurality of second gate trenches 112; along the first direction, the plurality of first gate trenches 111 and the plurality of second gate trenches 112 are arranged alternately, and the width of each first gate trench 111 and the width of each second gate trench 112 are not equal.

In other words, if the width of each first gate trench is smaller, the width of each second gate trench is larger correspondingly, so that small gate trenches and large gate trenches are arranged alternately along the first direction. This embodiment can effectively use the area of the wafer by the above arrangement, thereby improving the storage performance of the semiconductor structure.

In some embodiments, the semiconductor structure further includes a gate oxide layer 20, which is provided on the inner wall of each gate trench 11. The gate oxide layer 20 is used to insulate the gate structures 30 from the base 10.

In some embodiments, the semiconductor structure further includes a dielectric layer 40, which is provided on each conductive layer and fills each gate trench 11 located above each conductive layer 32, so that the top surface of the dielectric layer 40 is flush with the top surface of the base 10.

In this embodiment, the dielectric layer is provided to insulate the gate structures from other devices on the base, wherein the material of the dielectric layer may include silicon nitride.

Embodiment 3

In the related art, the conductive layers are usually made of tungsten. During testing of the conductivity of the conductive layers, only the widths and depths of the conductive layers need to be measured. The widths and depths of the conductive layers are used to measure the conductivity of the conductive layers. If the semiconductor structure is required to be miniaturized and integrated while the conductivity of the conductive layers needs to be ensured, the conventional gate structures can no longer meet the requirements. Therefore, this embodiment limits the structure and material of the conductive layers.

For example, the material of the conductive layers is changed from conventional tungsten to polysilicon, and the barrier layer and the conductive layers are designed to be laminated, so that sidewalls of each conductive layer are in direct contact with sidewalls of each gate trench, i.e. each conductive layer fills part of each gate trench, so that the gate structures can ensure the conductivity of the conductive layers and also meet the requirements of miniaturization and integration.

Since the material of the conductive layer in this embodiment includes polysilicon, in order to ensure the conductivity of the conductive layers, dopant atom concentration in the conductive layers needs to be measured. This embodiment of the present disclosure provides a method of measuring a semiconductor structure. The measurement method is for detecting the dopant atom concentration in the conductive layers of the semiconductor structure, to prevent the dopant atom concentration from being excessively high or excessively low and affecting the performance of the semiconductor structure.

Specifically, polysilicon is a dopant of phosphorus atoms and silicon atoms; a higher concentration of phosphorus atoms indicates higher conductivity of the conductive layers. Therefore, this embodiment needs to provide a new measurement method to detect the concentration of phosphorus atoms in the conductive layers, so as to measure the performance of the conductive layers by using the concentration of phosphorus atoms in the conductive layers.

Figure 11:
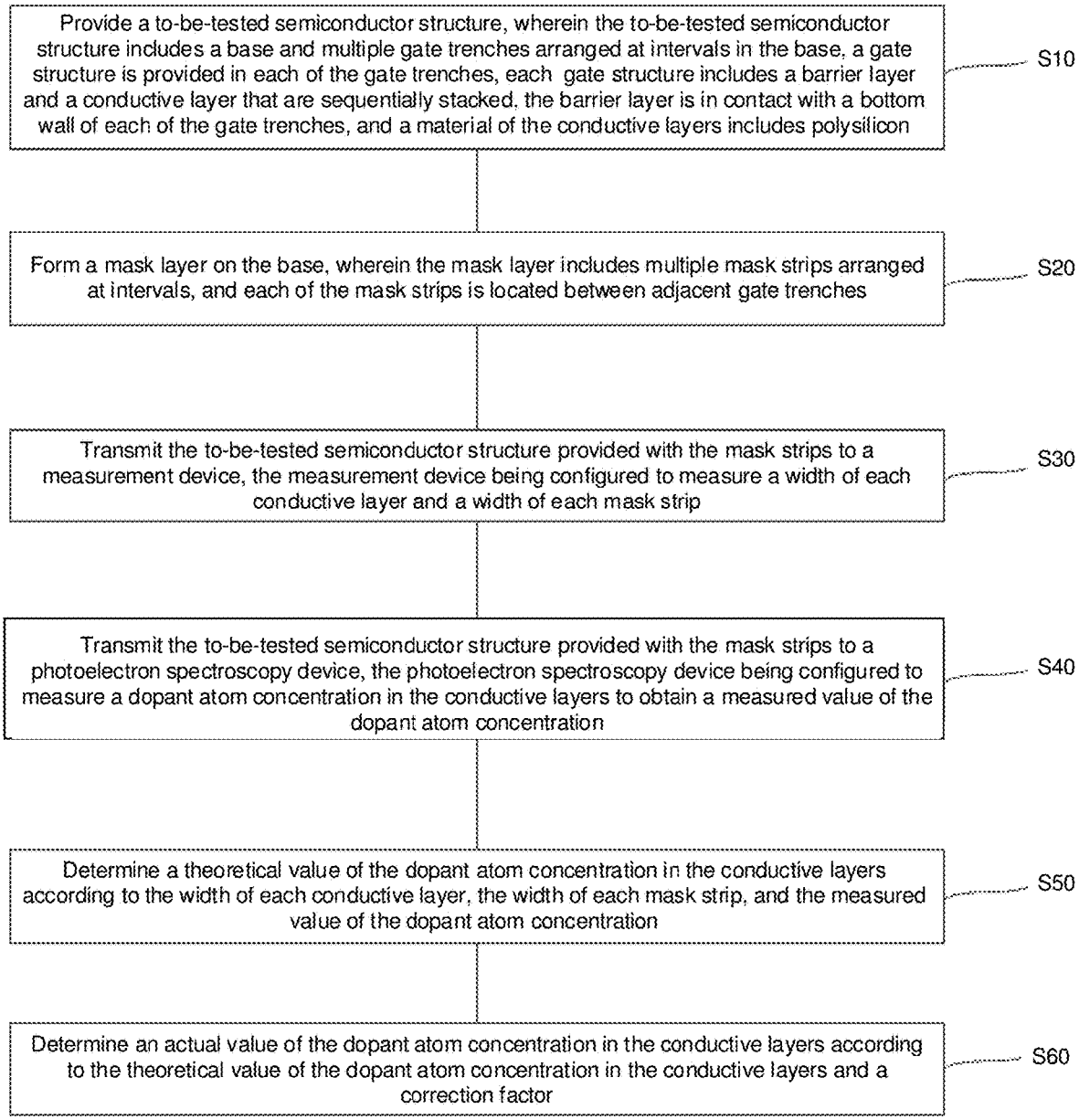
FIG. 11 is a flowchart of a method of measuring a semiconductor structure according to an embodiment of the present disclosure.

For example, as shown in FIG. 11, step S10: Provide a to-be-tested semiconductor structure, wherein the to-be-tested semiconductor structure includes a base and multiple gate trenches arranged at intervals in the base, a gate structure is provided in each of the gate trenches, the gate structure includes a barrier layer and a conductive layer that are sequentially stacked, the barrier layer in contact with a bottom wall of each gate trench, and a material of the conductive layers includes polysilicon.

Refer to FIG. 8 for the to-be-tested semiconductor structure. In order to measure the concentration of the conductive layers, it is necessary to expose the conductive layer 32 in each gate trench 11.

Step S20: Form a mask layer on the base, wherein the mask layer includes multiple mask strips arranged at intervals, and each of the mask strips is located between adjacent gate trenches.

Figure 12:
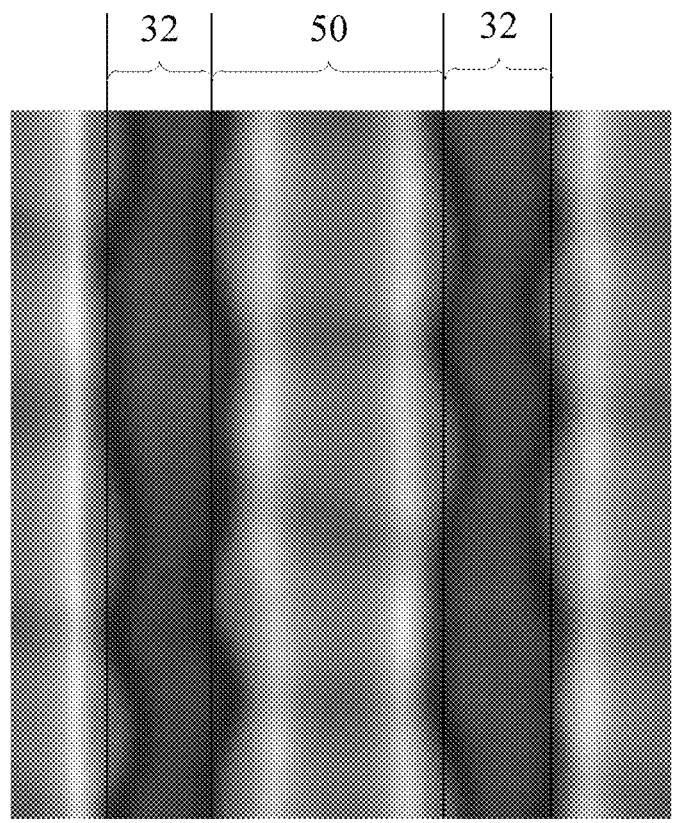
FIG. 12 is an electron microscope image of conductive layers and mask layers in the method of measuring a semiconductor structure according to an embodiment of the present disclosure.

In this embodiment, as shown in FIG. 12, one mask strip 50 can be formed by applying a photoresist layer of a certain thickness to the base located between the adjacent gate trenches. In this embodiment, by setting the mask strips, an area ratio of the conductive layers can be calculated in the subsequent process, thereby calculating the concentration of the conductive layers.

Step S30: Transmit the to-be-tested semiconductor structure provided with the mask strips to a measurement device, the measurement device being configured to measure a width of each conductive layer and a width of each mask strip.

For example, the to-be-tested semiconductor structure provided with the mask strips is transmitted to a CD atomic force microscopy or an OCD optical linewidth measurement device, which can measure the width $W_1$ of each conductive layer and the width $W_2$ of each mask strip.

Figure 13:
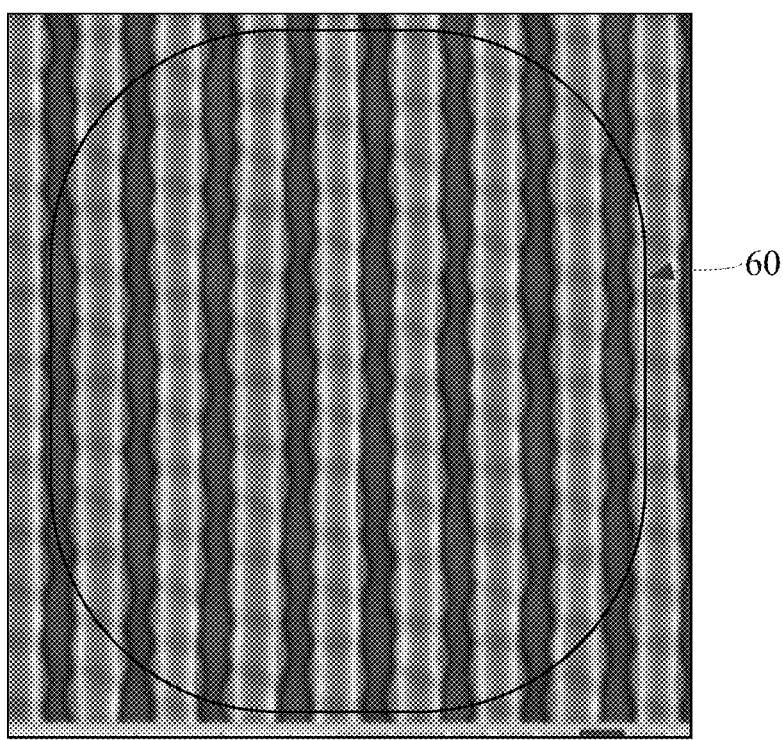
FIG. 13 is an image of a measurement spot in the method of measuring a semiconductor structure according to an embodiment of the present disclosure.

Step S40: Transmit the to-be-tested semiconductor structure provided with the mask strips to a photoelectron spectroscopy device that is used for measuring a dopant atom concentration in each conductive layer, to obtain a measured value of the dopant atom concentration. That is, the to-be-tested semiconductor structure may be transmitted to an X-ray photoelectron spectroscopy (XPS) that is provided with a measurement spot 60, a dopant atom concentration in the measurement spot is measured by using the photoelectron spectroscopy device, and the measurement spot can be adjusted according to an actual product to be tested. The measurement spot 60 is as shown in FIG. 13.

It should be noted that the principle of the X-ray photoelectron spectroscopy is to radiate the semiconductor structure with X-rays, so that inner electrons or valence electrons of atoms or molecules in the semiconductor structure are excited and emitted. Electrons excited by photons are called photoelectrons. The X-ray photoelectron spectroscopy can detect the energy and number of photoelectrons to obtain constituents and content of the constituents of the semiconductor structure.

Step S50: Determine a theoretical value of the dopant atom concentration in the conductive layers according to the width of each conductive layer, the width of each mask strip, and the measured value of the dopant atom concentration.

For example, the theoretical value $\rho_{theoretical}$ of the dopant atom concentration in each conductive layer can be obtained based on the following formula:

$$\rho_{theoretical} = \frac{\rho * (W_1 + W_2)}{W_1}$$

where $\rho$ represents the measured value of the dopant atom concentration, $W_1$ represents the width of each conductive layer, and $W_2$ represents the width of each mask strip.

In some embodiments, sizes of the adjacent gate trenches may be unequal. For example, the multiple gate trenches include a plurality of first gate trenches and a plurality of second gate trenches, the plurality of first gate trenches and the plurality of second gate trenches are arranged alternately along a first direction, and a width of each first gate trench is different from a width of each second gate trench. Correspondingly, the multiple mask strips include a plurality of first mask strips and a plurality of second mask strips, and a width of each first mask strip is different from a width of each second mask strip.

For example, along the first direction, the width of each first gate trench is less than the width of each second gate trench. The gate trenches with smaller and larger widths are arranged alternately. Correspondingly, the width of the con- For ease of description of the position of the conductive layers, the conductive layers located in the first gate trenches may be referred to as first conductive layers, and the conductive layers located in the second gate trenches may be referred to as second conductive layers, wherein specific values of the widths of the conductive layers and the mask strips are shown in the Table below:

TABLE 1

Specific Values of Widths of Conductive Layers and Mask Strips

| Measurement count | Coordinate point of measurement | Width of first conductive layer/μm | Width of second conductive layer/μm | Width of conductive layer/μm | Width of first mask strip/μm | Width of second mask strip/μm | Width of mask strip/μm | Sum of widths of conductive layer and mask strip/μm |
|---|---|---|---|---|---|---|---|---|
| 1 | 00, 00 | 25.78 | 26.90 | 26.34 | 13.85 | 15.28 | 14.54 | 40.88 |
| 2 | 05, −9 | 25.31 | 27.45 | 26.38 | 13.72 | 15.33 | 14.52 | 40.90 |
| 3 | 05, −13 | 25.28 | 27.44 | 26.36 | 13.36 | 15.77 | 14.53 | 40.89 |
| 4 | 00, −16 | 26.57 | 26.87 | 26.72 | 12.78 | 15.51 | 14.09 | 40.81 |
| 5 | −4, −8 | 26.42 | 26.76 | 26.59 | 14.05 | 14.57 | 14.28 | 40.87 |
| 6 | −10, −1 | 27.13 | 26.28 | 26.71 | 13.78 | 14.45 | 14.14 | 40.85 |
| 7 | −7, 10 | 26.54 | 26.42 | 26.48 | 15.25 | 13.47 | 14.41 | 40.89 |
| 8 | −2, 06 | 28.79 | 26.65 | 26.22 | 14.72 | 14.58 | 14.66 | 40.88 |
| 9 | 00, 07 | 25.57 | 26.95 | 26.26 | 14.93 | 14.35 | 14.65 | 40.91 |
| 10 | 04, 08 | 25.71 | 26.90 | 26.30 | 14.80 | 14.34 | 14.58 | 40.88 |
| 11 | 07, 12 | 26.53 | 26.68 | 26.60 | 15.30 | 13.16 | 14.34 | 40.94 |
| 12 | 08, 07 | 26.26 | 26.74 | 26.50 | 14.90 | 13.81 | 14.42 | 40.92 |
| Maximum | | 27.13 | 27.45 | 26.72 | 15.30 | 15.77 | 14.66 | 40.94 |
| Minimum | | 25.28 | 26.28 | 26.22 | 12.78 | 13.16 | 14.09 | 40.94 |
| Mean | | 26.07 | 26.84 | 26.46 | 14.29 | 14.55 | 14.43 | 40.89 |
| Max-Min | | 1.85 | 1.17 | 0.50 | 2.52 | 2.61 | 0.57 | 0.13 |
| 3Sigma | | 1.74 | 1.04 | 0.51 | 2.42 | 2.44 | 0.56 | 0.10 | ductive layer located in each first gate trench is also less than the width of the conductive layer located in each second gate trench. That is, along the first direction, the conductive layers with smaller and larger widths are arranged alternately. Moreover, the width of each first mask strip is also less than the width of each second mask strip; the mask strips with smaller and larger widths are arranged alternately.

To ensure the accuracy of the theoretical value of the concentration of phosphorus atoms in the conductive layers, an average value of the width of the conductive layer located in each first gate trench and the width of the conductive layer located in each second gate trench needs to be calculated. Correspondingly, an average value of the width of each first mask strip and the width of each second mask strip is calculated. Specifically:

The transmitting the to-be-tested semiconductor structure provided with the mask strips to a measurement device, the measurement device being configured to measure a width of each conductive layer and a width of each mask strip includes:

measuring a width $W_{11}$ of the conductive layer located in each first gate trench, and measuring a width $W_{12}$ of the conductive layer located in each second gate trench;

acquiring an average value of $W_{11}$ and $W_{12}$, wherein the average value is used as the width $W_1$ of each conductive layer;

measuring the width $W_{21}$ of each first mask strip, and measuring the width $W_{22}$ of each second mask strip; and acquiring an average value of $W_{21}$ and $W_{22}$, wherein the average value is used as the width $W_2$ of each mask strip.

According to Table 1, in this embodiment, the average value of the width of each first conductive layer and the width of each second conductive layer is used as the width of each conductive layer, and the average value of the width of each first mask strip and the width of each second mask strip is used as the width of each mask strip, to improve the accuracy of the phosphorus atom concentration test.

Step S60: Determine an actual value of the dopant atom concentration in the conductive layers according to the theoretical value of the dopant atom concentration in the conductive layers and a correction factor.

When the material of the conductive layers is polysilicon that is formed by a chemical vapor deposition process or physical vapor deposition process, during the deposition process, phosphorus atoms diffuse into the gate oxide layer, so the gate oxide layer is doped with phosphorus atoms. During measurement of the concentration of phosphorus atoms in the measurement spot, as shown in FIG. 13, there is a gate oxide layer in the measurement spot. Therefore, the concentration of phosphorus atoms in the measurement spot is detected to be greater than the concentration of phosphorus atoms in the conductive layers. Therefore, it is necessary to provide a correction factor, which is used to obtain the actual value of the phosphorus atom concentration.

In this embodiment, the correction factor is set to ensure the accuracy of the phosphorus atom concentration obtained by the measurement method and to provide an accurate theoretical basis for the design of the semiconductor structure.

Therefore, the measurement method of a semiconductor structure further includes: obtaining the correction factor k.

For example, a reference wafer is provided, which includes a substrate and a titanium nitride layer and a polysilicon layer that are sequentially stacked on the substrate. The thickness of the polysilicon layer is equal to the thickness of each conductive layer. The polysilicon layer is doped with phosphorus atoms under the same condition as that of the semiconductor structure, to simulate the conductive layers.

It should be noted that in this embodiment, the thickness of the polysilicon layer and the thickness of each conductive layer range from 10 nm to 15 nm.

The reference wafer is transmitted to a photoelectron spectroscopy device that is used for measuring a dopant atom concentration in the polysilicon layer of the reference wafer, i.e., the photoelectron spectroscopy is configured to measure the concentration of phosphorus atoms in the polysilicon layer.

As the thickness increases in the range of 0 nm to 30 nm, the concentration of phosphorus atoms detected by the photoelectron spectroscopy device varies in an approximately linear way. Therefore, the concentration of phosphorus atoms on the surface of the polysilicon layer detected by the photoelectron spectroscopy device can be used as the concentration of phosphorus atoms in the reference wafer, which is denoted by $\rho_{baseline}$.

At least one to-be-tested semiconductor structure is used as a sample, and the correction factor k is determined according to the theoretical value of the dopant atom concentration in the conductive layers of the sample and the dopant atom concentration in the polysilicon layer of the reference wafer.

When the correction factor is needed, the reference wafer can be prepared and placed into the photoelectron spectroscopy device together with the to-be-tested semiconductor structure. In order to distinguish the to-be-tested semiconductor structure placed in the photoelectron spectroscopy device together with the reference wafer from other to-be-tested semiconductor structures, in this embodiment, the to-be-tested semiconductor structure placed into the photoelectron spectroscopy device together with the reference wafer is called a sample.

The photoelectron spectroscopy device measures $\rho_{baseline}$ of the reference wafer and the measured value $\rho_{sample}$ of the dopant atom concentration in the conductive layers of the sample, and measures the width $W_{sample1}$ of each conductive layer in the sample and the width $W_{sample2}$ of each mask strip in the sample based on the method described in the above embodiment.

The correction factor k is obtained according to the foregoing values. For example, the correction factor k can be obtained based on the following formula:

$$k = \frac{\rho_{baseline} * W_{sample1}}{\rho_{sample} * (W_{sample1} + \rho_{sample2})}$$

wherein $\rho_{baseline}$ represents the dopant atom concentration of the reference wafer, $\rho_{sample}$ represents the measured value of the dopant atom concentration of the sample used for determining the correction factor, $W_{sample1}$ represents the width of each conductive layer of the sample used for determining the correction factor, and $W_{sample2}$ represents the width of each mask strip of the sample used for determining the correction factor.

It should be noted that, in this embodiment, one or more samples can be provided. When there are multiple samples, multiple correction factors are calculated in the above manner, and an average value of the multiple correction factors is used as the final correction factor k. This can ensure the accuracy of the correction factor k.

In this embodiment, the concentration of phosphorus atoms in the reference wafer measured by the photoelectron spectroscopy is 15.47%, i.e., the value of $\rho_{baseline}$ is 15.47%.

Using the values of the coordinate point (−4, −8) of the to-be-tested product in Table 1 as reference values, it is calculated that $W_1/(W_1+W_2)=14.28/(14.28+26.59)=34.9\%$, and a correction factor of 0.88 is obtained based on the value of $\rho_{sample}$. This correction factor is used as a standard in future tests, and needs to be used as a multiplier each time the actual concentration of phosphorus atoms in the product is measured.

For example, the actual value of the phosphorus atom concentration in the conductive layers is determined according to the theoretical value of the phosphorus atom concentration in the conductive layers and the correction factor based on the following equation:

$$\rho_{actual} = k * \rho_{theoretical}$$

In this embodiment, by setting the correction factor, the accuracy of dopant atoms in each to-be-tested semiconductor structure obtained by the above measurement method can be ensured, which provides a theoretical basis for the performance of the semiconductor structure.

Each embodiment or implementation in the specification of the present disclosure is described in a progressive manner. Each embodiment focuses on the difference from other embodiments, and the same and similar parts between the embodiments may refer to each other.

In the descriptions of this specification, a description with reference to the term "one implementation", "some implementations", "an exemplary implementation", "an example", "a specific example", "some examples", or the like means that a specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

Finally, it should be noted that the above embodiments are merely used to explain the technical solutions of the present disclosure, but are not intended to limit the present disclosure. Although the present disclosure is described in detail with reference to the foregoing embodiments, those of ordinary skill in the art should understand that they can still modify the technical solutions described in the foregoing embodiments, or make equivalent substitutions on some or all technical features therein. These modifications or substitutions do not make the essence of the corresponding technical solutions deviate from the spirit and scope of the technical solutions of the embodiments of the present disclosure.

The invention claimed is:

1. A method of manufacturing a semiconductor structure, comprising:
    providing a base;
    forming multiple gate trenches arranged at intervals on the base; wherein the multiple gate trenches comprise a plurality of first gate trenches and a plurality of second gate trenches, the plurality of first gate trenches and the plurality of second gate trenches are arranged alternately along a first direction, and a width of each of the first gate trenches is different from a width of each of the second gate trenches; and forming a gate structure in each of the gate trenches, wherein each gate structure comprises a barrier layer and a conductive layer, the barrier layer and the conductive layer are sequentially stacked, the barrier layer is in contact with a bottom wall of each of the gate trenches, and a material of conductive layers comprises polysilicon.

2. The method of manufacturing a semiconductor structure according to claim 1, wherein a thickness of each of the conductive layers is ¼ to ½ of a depth of each of the gate trenches.

3. The method of manufacturing a semiconductor structure according to claim 2, wherein the forming a gate structure in each of the gate trenches comprises:

forming an initial barrier layer in each of the gate trenches, wherein the initial barrier layer fills the gate trenches;

removing the initial barrier layer located in the gate trenches by a certain thickness, wherein the retained initial barrier layer forms the barrier layer;

forming an initial conductive layer on the barrier layer, wherein the initial conductive layer fills the gate trenches located above the barrier layer; and removing the initial conductive layer by a certain thickness, wherein the retained initial conductive layer forms the conductive layers.

4. The method of manufacturing a semiconductor structure according to claim 3, wherein after the forming multiple gate trenches arranged at intervals on the base and before the forming a gate structure in each of the gate trenches, the method further comprises:

forming a gate oxide layer on an inner wall of each of the gate trenches.

5. The method of manufacturing a semiconductor structure according to claim 1, wherein after the forming a gate structure in each of the gate trenches, the method further comprises:

forming a dielectric layer on each of the conductive layers, wherein the dielectric layer fills the gate trenches located above each of the conductive layers, and a top surface of the dielectric layer is flush with a top surface of the base.

6. A semiconductor structure, comprising: a base and multiple gate trenches arranged at intervals in the base, wherein a gate structure is provided in each of the gate trenches, each gate structure comprises a barrier layer and a conductive layer, the barrier layer and the conductive layer are sequentially stacked, the barrier layer is in contact with a bottom wall of each of the gate trenches, and a material of the conductive layers comprises polysilicon;

wherein the multiple gate trenches comprise a plurality of first gate trenches and a plurality of second gate trenches, the plurality of first gate trenches and the plurality of second gate trenches are arranged alternately along a first direction, and a width of each of the first gate trenches is different from a width of each of the second gate trenches.

7. The semiconductor structure according to claim 6, wherein the semiconductor structure further comprises a gate oxide layer, which is provided on an inner wall of each of the gate trenches.

8. The semiconductor structure according to claim 7, further comprising a dielectric layer, wherein the dielectric layer is provided on each of the conductive layers and fills the gate trenches located above each of the conductive layers.

9. A method of measuring a semiconductor structure, the method comprising:

providing a to-be-tested semiconductor structure, wherein the to-be-tested semiconductor structure comprises a base and multiple gate trenches arranged at intervals in the base, a gate structure is provided in each of the gate trenches, each gate structure comprises a barrier layer and a conductive layer, the barrier layer and the conductive layer are sequentially stacked, the barrier layer is in contact with a bottom wall of each of the gate trenches, and a material of the conductive layers comprises polysilicon;

forming a mask layer on the base, wherein the mask layer comprises multiple mask strips arranged at intervals, and each of the mask strips is located between adjacent gate trenches;

transmitting the to-be-tested semiconductor structure provided with the mask strips to a measurement device, the measurement device being configured to measure a width of each of the conductive layers and a width of each of the mask strips;

transmitting the to-be-tested semiconductor structure provided with the mask strips to a photoelectron spectroscopy device, the photoelectron spectroscopy device being configured to measure a dopant atom concentration in the conductive layers to obtain a measured value of the dopant atom concentration;

determining a theoretical value of the dopant atom concentration in the conductive layers according to the width of each of the conductive layers, the width of each of the mask strips, and the measured value of the dopant atom concentration; and determining an actual value of the dopant atom concentration in the conductive layers according to the theoretical value of the dopant atom concentration in the conductive layers and a correction factor.

10. The method of measuring a semiconductor structure according to claim 9, wherein the theoretical value $\rho_{theoretical}$ of the dopant atom concentration in the conductive layers is determined according to the width of each of the conductive layers, the width of each of the mask strips, and the measured value of the dopant atom concentration based on the following formula:

$$\rho_{theoretical} = \frac{\rho * (W_1 + W_2)}{W_1}$$

wherein $\rho$ represents the measured value of the dopant atom concentration, $W_1$ represents the width of each of the conductive layers, and $W_2$ represents the width of each of the mask strips.

11. The method of measuring a semiconductor structure according to claim 10, wherein the multiple gate trenches comprise a plurality of first gate trenches and a plurality of second gate trenches, the plurality of first gate trenches and the plurality of second gate trenches are arranged alternately along a first direction, and a width of each of the first gate trenches is different from a width of each of the second gate trenches; the multiple mask strips comprise a plurality of first mask strips and a plurality of second mask strips, and when a width of each of the first mask strips is different from a width of each of the second mask strips, the transmitting the to-be-measurement tested semiconductor structure provided with the mask strips to a measurement device, the device being configured to measure a width of each of the conductive layers and a width of each of the mask strips comprises:
  measuring a width $W_{11}$ of the conductive layer located in each of the first gate trenches, and measuring a width $W_{12}$ of the conductive layer located in each of the second gate trenches;
  acquiring an average value of $W_{11}$ and $W_{12}$, wherein the average value is used as a width $W_1$ of each of the conductive layers;
  measuring a width $W_{21}$ of each of the first mask strips, and measuring a width $W_{22}$ of each of the second mask strips; and
  acquiring an average value of $W_{21}$ and $W_{22}$, wherein the average value is used as a width $W_2$ of each of the mask strips.

12. The method of measuring a semiconductor structure according to claim 9, wherein the method comprises:
  providing a reference wafer, wherein the reference wafer comprises a substrate as well as a titanium nitride layer and a polysilicon layer, the titanium nitride layer and the polysilicon layer are sequentially stacked on the substrate, and a thickness of the polysilicon layer is equal to a thickness of each of the conductive layers;
  transmitting the reference wafer to a photoelectron spectroscopy device, the photoelectron spectroscopy device being configured to measure a dopant atom concentration in the polysilicon layer of the reference wafer; and
  using at least one to-be-tested semiconductor structure as a sample, and determining the correction factor k according to the theoretical value of the dopant atom concentration in the conductive layers of the sample and the dopant atom concentration in the polysilicon layer of the reference wafer.

13. The method of measuring a semiconductor structure according to claim 12, wherein the using at least one to-be-tested semiconductor structure as a sample, and determining the correction factor k according to the theoretical value of the dopant atom concentration in the conductive layers of the sample and the dopant atom concentration in the polysilicon layer of the reference wafer is implemented based on the following formula:

$$k = \frac{\rho_{baseline} * W_{sample1}}{\rho_{sample} * (W_{sample1} + \rho_{sample2})}$$

wherein $\rho_{baseline}$ baseline represents the dopant atom concentration in the polysilicon layer of the reference wafer, $\rho_{sample}$ represents the measured value of the dopant atom concentration of the sample used for determining the correction factor, $W_{sample1}$ represents the width of each of the conductive layers of the sample used for determining the correction factor, and $W_{sample\,2}$ represents the width of each of the mask strips of the sample used for determining the correction factor.

14. The method of measuring a semiconductor structure according to claim 13, wherein the actual value of the dopant atom concentration in the conductive layers is determined according to the theoretical value of the dopant atom concentration in the conductive layers and the correction factor based on the following formula:

$\rho_{actual} = k * \rho_{theoretical}$.

* * * * *